(12) United States Patent
Sung et al.

(10) Patent No.: US 8,778,784 B2
(45) Date of Patent: Jul. 15, 2014

(54) STRESS REGULATED SEMICONDUCTOR DEVICES AND ASSOCIATED METHODS

(75) Inventors: Chien-Min Sung, Tansui (TW); Ming Chi Kan, Rende Township (TW); Shao Chung Hu, Xindian (TW)

(73) Assignee: RiteDia Corporation, Hsin Chu Industrial Park (TW)

( * ) Notice: Subject to any disclaimer, the term of this patent is extended or adjusted under 35 U.S.C. 154(b) by 206 days.

(21) Appl. No.: 13/284,900

(22) Filed: Oct. 29, 2011

(65) Prior Publication Data

US 2012/0280253 A1     Nov. 8, 2012

Related U.S. Application Data

(63) Continuation-in-part of application No. 13/239,189, filed on Sep. 21, 2011, now Pat. No. 8,531,026.

(60) Provisional application No. 61/408,447, filed on Oct. 29, 2010, provisional application No. 61/384,976, filed on Sep. 21, 2010, provisional application No. 61/468,917, filed on Mar. 29, 2011.

(51) Int. Cl.
     *H01L 21/20*      (2006.01)

(52) U.S. Cl.
     USPC .................... 438/479; 438/408; 257/E21.128

(58) Field of Classification Search
     USPC .......... 257/77, 720, 99, 76, E23.08, E33.075, 257/E29.104
See application file for complete search history.

(56) References Cited

U.S. PATENT DOCUMENTS

| | | | |
|---|---|---|---|
| 3,574,580 | A | 4/1971 | Stromberg et al. |
| 3,678,995 | A | 7/1972 | Collard |
| 3,828,848 | A | 8/1974 | Custers et al. |
| 3,829,544 | A | 8/1974 | Hall |
| 3,872,496 | A | 3/1975 | Potter |
| 3,912,500 | A | 10/1975 | Vereschagin et al. |
| 3,913,280 | A | 10/1975 | Hall |
| 3,949,263 | A | 4/1976 | Harper |
| 4,224,380 | A | 9/1980 | Bovenkerk et al. |
| 4,231,195 | A | 11/1980 | DeVries et al. |

(Continued)

FOREIGN PATENT DOCUMENTS

| | | |
|---|---|---|
| EP | 0391418 | 10/1990 |
| EP | 0898310 | 2/1999 |

(Continued)

OTHER PUBLICATIONS

U.S. Appl. No. 13/239,189, filed Sep. 21, 2011; Chien-Min Sung; office action dated Dec. 21, 2012.

(Continued)

*Primary Examiner* — Zandra Smith
*Assistant Examiner* — Paul Patton
(74) *Attorney, Agent, or Firm* — Thorpe North & Western LLP

(57) ABSTRACT

Stress regulated semiconductor devices and associated methods are provided. In one aspect, for example, a stress regulated semiconductor device can include a semiconductor layer, a stress regulating interface layer including a carbon layer formed on the semiconductor layer, and a heat spreader coupled to the carbon layer opposite the semiconductor layer. The stress regulating interface layer is operable to reduce the coefficient of thermal expansion difference between the semiconductor layer and the heat spreader to less than or equal to about 10 ppm/° C.

17 Claims, 5 Drawing Sheets

(56) References Cited

U.S. PATENT DOCUMENTS

| | | |
|---|---|---|
| 4,378,233 A | 3/1983 | Carver |
| 4,425,195 A | 1/1984 | Papanicolaou |
| 4,518,659 A | 5/1985 | Gigl et al. |
| 4,534,773 A | 8/1985 | Phaal et al. |
| 4,576,224 A | 3/1986 | Eaton et al. |
| 4,617,181 A | 10/1986 | Yazu et al. |
| 4,649,992 A | 3/1987 | Geen et al. |
| 4,664,705 A | 5/1987 | Horton et al. |
| 4,948,388 A | 8/1990 | Ringwood |
| 5,008,737 A | 4/1991 | Burnham et al. |
| 5,045,972 A | 9/1991 | Supan et al. |
| 5,070,936 A | 12/1991 | Carroll et al. |
| 5,094,985 A | 3/1992 | Kijima et al. |
| 5,096,465 A | 3/1992 | Chen |
| 5,120,495 A | 6/1992 | Supan et al. |
| 5,130,771 A | 7/1992 | Burnham et al. |
| 5,224,017 A | 6/1993 | Martin |
| 5,382,314 A | 1/1995 | Jin |
| 5,542,471 A | 8/1996 | Dickson |
| 5,614,320 A | 3/1997 | Beane et al. |
| 5,642,779 A | 7/1997 | Yamamoto et al. |
| 5,660,894 A | 8/1997 | Chen et al. |
| 5,672,548 A | 9/1997 | Culnane et al. |
| 5,696,665 A | 12/1997 | Nagy |
| 5,719,441 A | 2/1998 | Larimer |
| 5,783,316 A | 7/1998 | Colella et al. |
| 5,785,799 A | 7/1998 | Culnane et al. |
| 5,786,075 A | 7/1998 | Mishuku et al. |
| 5,812,570 A | 9/1998 | Spaeth |
| 5,834,337 A | 11/1998 | Unger et al. |
| 5,895,972 A | 4/1999 | Paniccia |
| 5,982,623 A | 11/1999 | Matsuo et al. |
| 6,031,285 A | 2/2000 | Nishibayashi |
| 6,039,641 A | 3/2000 | Sung |
| 6,167,948 B1 | 1/2001 | Thomas |
| 6,171,691 B1 | 1/2001 | Nishibayashi |
| 6,193,770 B1 | 2/2001 | Sung |
| 6,215,661 B1 | 4/2001 | Messenger et al. |
| 6,238,454 B1 | 5/2001 | Polese et al. |
| 6,264,882 B1 | 7/2001 | Colella et al. |
| 6,270,848 B1 | 8/2001 | Nishibayashi |
| 6,280,496 B1 | 8/2001 | Kawai et al. |
| 6,284,315 B1 | 9/2001 | Tzeng |
| 6,335,863 B1 | 1/2002 | Yamamoto et al. |
| 6,337,513 B1 | 1/2002 | Clevenger et al. |
| 1,382,080 A1 | 2/2002 | Hall et al. |
| 6,361,857 B1 | 3/2002 | Saito et al. |
| 6,369,455 B1 | 4/2002 | Ho et al. |
| 6,390,181 B1 | 5/2002 | Hall et al. |
| 6,407,922 B1 | 6/2002 | Eckblad et al. |
| 6,413,589 B1 | 7/2002 | Li |
| 6,447,852 B1 | 9/2002 | Gordeev et al. |
| 6,448,642 B1 | 9/2002 | Bewley et al. |
| 6,482,248 B1 | 11/2002 | Holloway |
| 6,517,221 B1 | 2/2003 | Xie |
| 6,534,792 B1 | 3/2003 | Schaffer |
| 6,538,892 B2 | 3/2003 | Smalc |
| 6,541,115 B2 | 4/2003 | Pender et al. |
| 6,653,730 B2 | 11/2003 | Chrysler et al. |
| 6,706,562 B2 | 3/2004 | Mahajan et al. |
| 6,709,747 B1 | 3/2004 | Gordeev et al. |
| 6,758,263 B2 | 7/2004 | Krassowski et al. |
| 6,837,935 B2 | 1/2005 | Meguro et al. |
| 6,914,025 B2 | 7/2005 | Ekstrom et al. |
| 6,984,888 B2 | 1/2006 | Sung |
| 6,987,318 B2 | 1/2006 | Sung |
| 7,008,672 B2 | 3/2006 | Gordeev et al. |
| 7,014,093 B2 | 3/2006 | Houle et al. |
| 7,173,334 B2 | 2/2007 | Sung |
| 7,268,011 B2 | 9/2007 | Sung |
| 7,268,372 B2 | 9/2007 | Park et al. |
| 7,384,821 B2 | 6/2008 | Sung |
| 7,791,188 B2 | 9/2010 | Sung |
| 7,893,443 B2 | 2/2011 | Kim et al. |
| 2001/0031360 A1 | 10/2001 | Rudder et al. |
| 2002/0023733 A1* | 2/2002 | Hall et al. ............... 165/80.3 |
| 2003/0047814 A1 | 3/2003 | Kwon |
| 2003/0168731 A1 | 9/2003 | Matayabas et al. |
| 2004/0053039 A1 | 3/2004 | Ekstrom et al. |
| 2004/0175875 A1* | 9/2004 | Sung ........................ 438/197 |
| 2004/0183172 A1 | 9/2004 | Saito et al. |
| 2004/0238946 A1 | 12/2004 | Tachibana et al. |
| 2005/0019114 A1 | 1/2005 | Sung |
| 2005/0025973 A1 | 2/2005 | Slutz et al. |
| 2005/0051891 A1 | 3/2005 | Yoshida et al. |
| 2005/0189647 A1 | 9/2005 | Sung |
| 2005/0231983 A1 | 10/2005 | Dahm |
| 2005/0250250 A1 | 11/2005 | Sung |
| 2005/0276979 A1 | 12/2005 | Slutz et al. |
| 2005/0287766 A1* | 12/2005 | Chrysler et al. ........... 438/459 |
| 2006/0091532 A1 | 5/2006 | Sung |
| 2006/0113546 A1* | 6/2006 | Sung ........................ 257/77 |
| 2006/0154392 A1 | 7/2006 | Tran et al. |
| 2006/0176924 A1 | 8/2006 | Kim et al. |
| 2006/0185836 A1 | 8/2006 | Garner |
| 2007/0128994 A1 | 6/2007 | Sung |
| 2007/0170581 A1 | 7/2007 | Sung |
| 2007/0269964 A1* | 11/2007 | Sung ........................ 438/479 |
| 2007/0278496 A1 | 12/2007 | Shieh et al. |
| 2007/0298537 A1 | 12/2007 | Sung |
| 2008/0019098 A1 | 1/2008 | Sung |
| 2008/0029883 A1 | 2/2008 | Sung |
| 2008/0251798 A1 | 10/2008 | Ogihara et al. |
| 2008/0296584 A1 | 12/2008 | Hachigo |
| 2008/0296756 A1 | 12/2008 | Koch et al. |
| 2009/0001383 A1* | 1/2009 | Sung ........................ 257/77 |
| 2010/0101710 A1 | 4/2010 | Choi et al. |
| 2010/0102442 A1 | 4/2010 | Sung |
| 2010/0104494 A1 | 4/2010 | Meng et al. |
| 2010/0105166 A1 | 4/2010 | Francis et al. |
| 2010/0212727 A1 | 8/2010 | Lee |
| 2010/0213175 A1 | 8/2010 | Peng et al. |
| 2010/0213485 A1 | 8/2010 | McKenzie et al. |
| 2010/0213486 A1 | 8/2010 | Shi |
| 2010/0216301 A1 | 8/2010 | Chen et al. |

FOREIGN PATENT DOCUMENTS

| | | |
|---|---|---|
| EP | 991121 | 4/2000 |
| EP | 1432029 | 6/2004 |
| EP | 1452614 | 9/2004 |
| GB | 1382080 | 1/1975 |
| JP | 06015571 | 1/1994 |
| JP | 09312362 | 12/1997 |
| JP | 10223812 | 8/1998 |
| JP | 11067991 | 3/1999 |
| JP | 2000303126 | 10/2000 |
| JP | 2004146413 | 5/2004 |
| JP | 2004175626 | 6/2004 |
| WO | WO01/48816 | 7/2001 |
| WO | WO03/040420 | 5/2003 |
| WO | WO2004/034466 | 4/2004 |
| WO | WO2010/092972 | 8/2010 |

OTHER PUBLICATIONS

PCT Application PCT/US2011/058487; filed Oct. 29, 2011; Chien-Min Sung; search report mailed May 30, 2012.

U.S. Appl. No. 13/239,198, filed Sep. 21, 2011; Chien-Min Sung.

Horton et al; Sintered Diamond; International Industrial Diamond Association Symposium; Washington, D.C.; 1974; pp. 1-6.

Butler et al; Chemical Vapor Deposited Diamond, Maturity and Diversity; The Electrochemical Society Interface; Spring 2003; pp. 22-26.

Chen et al; Effect of Nucleation Methods on Characteristics of Low-Temperature Deposited Ultrananocrystalline Diamond; Abstract only; http://nano.anl.gov.ADC2005/pdfs/abstracts/pster2.9-8ADC0037Lin.pdf; printed May 2005; pp. 1-2.

Hall et al; Sintered Diamonds; Science; Aug. 28, 1970; pp. 1-2; vol. 169.

Huang et al; Synthesis of Large-Area, Think, Uniform, Smooth Ultrananocrystalline Diamond Films by Microwave Plasma-As-

(56) References Cited

OTHER PUBLICATIONS sisted Chemical Vapor Deposition; Abstract only; http://nano.anl.gov/ADC2005/pdfs/abstracts/poster1/9-1_AD; Printed May 2005; pp. 1-2.

Liu et al; Studies on Nucleation Process in Diamond CVD: An Overview of Recent Development; Diamond and Related Materials; Sep. 1995; pp. 1-28; vol. 4, issue 10.

Liu et al; Nucleation Kinetics of Diamond on Carbide-Forming Substrates During CVD-I. Transient Nucleation Stage; Fourth International Symposium on Diamond Materials; Reno, NV; May 21-26, 1995; pp. 1-16.

Sun et al; Fabrication and Characterization of Diamond-Copper Composites for Thermal Management Substrate Applications; Abstract only; Materials Science and Engineering B41; 1996; p. 1.

May et al; Diamond Thin Films: A $21^{st}$-Century Material; Phil. Trans. R. Soc. Lond.; 2000; pp. 473-495; vol. 358.

Patsil et al; Microwave Plasma Deposition of Diamond Like Carbon Coatings; Pramana-Journal of Physics; Nov. and Dec. 2000; pp. 933-939; vol. 55, Nos. 5-6.

Piazza et al; Effects of Nano- and Micor-Crystalline Seeds on the Growth of Nano- and Micro-Crystalline Diamond Thin Films; Abstract Only; http://nano.anl.gov.ADC2005.pdfs/abstracts/poster2/9-10_ADC0071_Morell.pdf; printed May 2005; pp. 1-2.

Piazza et al; Micro- and Nano-Crystalline Diamond Film Synthesis at Substrate Temperatures Sub 400° C.; Abstract only; http://nano.anl.gov/ADC2005/pdfs/abstract/session9/ADC0069_Morell.pdf; printed May 2005; pp. 1-2.

Pope et al; Sintered Diamond: Its Possible Use as a High Thermal Conductivity Semiconduction Device Substrate; Proc. $4^{th}$ International Conference on High Pressure (AIRAPT); Kyoto, Japan; 1974; pp. 1-5.

U.S. Appl. No. 12/255,823, filed Oct. 22, 2008; Chien-Min Sung; notice of allowance dated Sep. 21, 2012.

U.S. Appl. No. 12/168,110, filed Jul. 5, 2008; Chien-Min Sung; notice of allowance dated Sep. 28, 2012.

U.S. Appl. No. 13/239,189, filed Sep. 21, 2011; Chien-Min Sung; notice of allowance dated May 3, 2013.

\* cited by examiner

STRESS REGULATED SEMICONDUCTOR DEVICES AND ASSOCIATED METHODS

PRIORITY DATA

This application claims the benefit of U.S. Provisional Patent Application Ser. No. 61/408,447, filed on Oct. 29, 2010, which is incorporated herein by reference in its entirety. This application also is also a continuation-in-part of U.S. patent application Ser. No. 13/239,189, filed on Sep. 21, 2011, which claims the benefit of U.S. Provisional Patent Application Ser. Nos. 61/384,976 and 61/468,917, filed on Sep. 21, 2010 and Mar. 29, 2011 respectively, all of which are incorporated herein by reference.

FIELD OF THE INVENTION

The present invention relates generally to semiconductor devices and associated methods. Accordingly, the present invention involves the electrical and material science fields.

BACKGROUND OF THE INVENTION

In many developed countries, major portions of the populations consider electronic devices to be integral to their lives. Such increasing use and dependence has generated a demand for electronics devices that are smaller and faster. As electronic circuitry increases in speed and decreases in size, cooling of such devices becomes problematic.

Electronic devices generally contain printed circuit boards having integrally connected electronic components that allow the overall functionality of the device. These electronic components, such as processors, transistors, resistors, capacitors, light-emitting diodes (LEDs), etc., generate significant amounts of heat. As it builds, heat can cause various thermal problems associated with such electronic components. Significant amounts of heat can affect the reliability of an electronic device, or even cause it to fail by, for example, causing burn out or shorting both within the electronic components themselves and across the surface of the printed circuit board. Thus, the buildup of heat can ultimately affect the functional life of the electronic device. This is particularly problematic for electronic components with high power and high current demands, as well as for the printed circuit boards that support them.

Various cooling devices have been employed such as fans, heat sinks, Peltier and liquid cooling devices, etc., as means of reducing heat buildup in electronic devices. As increased speed and power consumption cause increasing heat buildup, such cooling devices generally must increase in size to be effective and may also require power to operate. For example, fans must be increased in size and speed to increase airflow, and heat sinks must be increased in size to increase heat capacity and surface area. The demand for smaller electronic devices, however, not only precludes increasing the size of such cooling devices, but may also require a significant size decrease.

SUMMARY OF THE INVENTION

Accordingly, the present invention provides stress regulated semiconductor devices and associated methods thereof. In one aspect, for example, a stress regulated semiconductor device can include a semiconductor layer, a stress regulating interface layer including a carbon layer bonded to the semiconductor layer by a carbide former, and a heat spreader coupled to the stress regulating interface layer opposite the semiconductor layer. The stress regulating interface layer is operable to reduce the coefficient of thermal expansion difference between the semiconductor layer and the heat spreader to less than or equal to about 10 ppm/° C. In another aspect, the stress regulating interface layer is operable to reduce the coefficient of thermal expansion difference between the semiconductor layer and the heat spreader to less than or equal to about 5 ppm/° C.

A variety of semiconductor materials are contemplated from which the devices according to aspects of the present invention can be constructed. In one aspect, nonlimiting examples of semiconductor materials can include silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and the like, including composites thereof. In one specific aspect, the semiconductor material can include gallium nitride, aluminum nitride, and composites thereof.

Various carbon materials are also contemplated for inclusion in the carbon layers according to aspects of the present invention. Nonlimiting examples can include diamond-like carbon, boron-doped diamond, amorphous diamond, crystalline diamond, polycrystalline diamond, graphite, and the like, including combinations thereof. In one specific aspect, the carbon layer has an amorphous atomic structure. In another specific aspect the carbon layer is diamond-like carbon. In yet another specific aspect the carbon layer is boron-doped diamond.

Various materials are contemplated for use in the heat spreader layers according to various aspects of the present invention. Nonlimiting examples can include aluminum, copper, tin, tungsten, nickel, titanium, gold, silver, platinum, $Al_2O_3$, AlN, $Si_3N_4$, Si, glass, and combinations and alloys thereof, and the like, including alloys and mixtures thereof. In one specific aspect the heat spreader includes copper.

In another aspect, a reflective layer disposed between the carbon layer and the semiconductor layer. In a more specific aspect, a carbide former layer can be disposed between the carbon layer and the reflective layer. In yet another aspect, a carbide former layer can be disposed between the carbon layer and the heat spreader layer.

In another aspect of the present invention, a stress regulated semiconductor device is provided. Such a device can include a semiconductor layer and a heat spreader formed on the semiconductor layer, where the heat spreader includes diamond particles uniformly disposed within a metal matrix. The diamond particles are operable to reduce the coefficient of thermal expansion difference between the semiconductor layer and the metal matrix to less than or equal to about 10 ppm/° C. In another aspect, the diamond particles are operable to reduce the coefficient of thermal expansion difference between the semiconductor layer and the metal matrix to less than or equal to about 5 ppm/° C.

In yet another aspect of the present invention, a stress regulated semiconductor device is provided. Such a device can include a semiconductor layer, an electrically conductive boron nitride layer formed on the semiconductor layer, and a heat spreader coupled to the boron nitride layer opposite the semiconductor layer. The boron nitride layer is operable to reduce the coefficient of thermal expansion difference between the semiconductor layer and the heat spreader to less than or equal to about 10 ppm/° C.

In a further aspect of the present invention, a method for reducing stress induced defects in a semiconductor device is provided. Such a method can include forming a stress regulating interface layer including a carbon layer on a semiconductor layer, and coupling a heat spreader layer to the stress regulating interface layer opposite the semiconductor layer. In some aspects, coupling the heat spreader to the stress regulating interface layer includes forming the heat spreader on the stress regulating interface layer. The stress regulating interface layer reduces the coefficient of thermal expansion difference between the semiconductor layer and the heat spreader to less than or equal to about 10 ppm/° C. In another aspect, the method can further include forming a reflective layer between the stress regulating interface layer and the semiconductor layer. In a more specific aspect, the method can further include forming a carbide former layer between the carbon layer and the reflective layer. In yet another aspect, the method can include forming a carbide former layer between the carbon layer and the metal heat spreader layer.

In another aspect of the present invention, a stress regulated light-emitting semiconductor device is provided. Such a device can include a light-emitting semiconductor material, a carbon layer formed on the semiconductor material, and a metal heat spreader coupled to the carbon layer, wherein the carbon layer is operable to reduce the coefficient of thermal expansion difference between the semiconductor layer and the metal heat spreader to less than or equal to about 10 ppm/° C. In one aspect, the metal heat spreader is formed on the carbon layer.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

DETAILED DESCRIPTION OF THE INVENTION

Definitions

Figure 1:
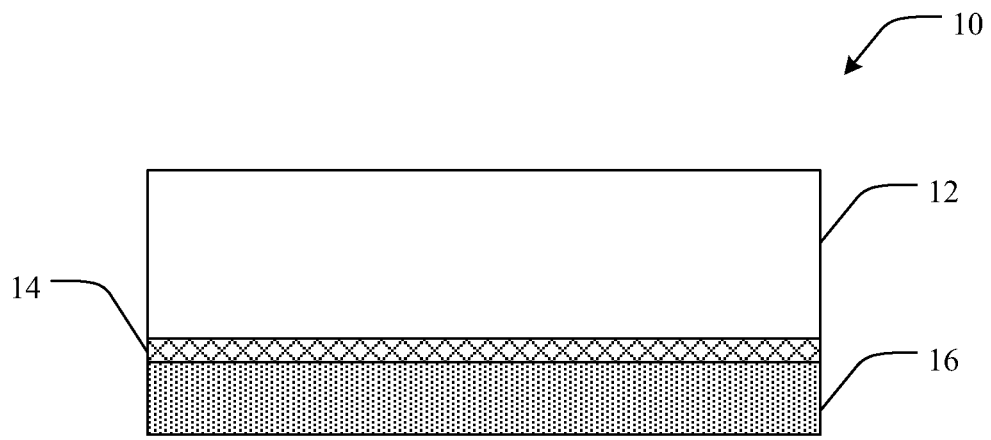
FIG. 1 is a cross-section view of a stress regulated semiconductor device in accordance with one embodiment of the present invention.

In describing and claiming the present invention, the following terminology will be used in accordance with the definitions set forth below.

The singular forms "a," "an," and, "the" include plural referents unless the context clearly dictates otherwise. Thus, for example, reference to "a dopant" includes reference to one or more of such dopants, and reference to "the diamond layer" includes reference to one or more of such layers.

As used herein, "vapor deposited" refers to materials which are formed using vapor deposition techniques. "Vapor deposition" refers to a process of forming or depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), laser ablation, conformal diamond coating processes, metal-organic CVD (MOCVD), sputtering, thermal evaporation PVD, ionized metal PVD (IMPVD), electron beam PVD (EBPVD), reactive PVD, cathodic arc, and the like.

As used herein, "chemical vapor deposition," or "CVD" refers to any method of chemically forming or depositing diamond particles in a vapor form upon a surface. Various CVD techniques are well known in the art.

As used herein, "physical vapor deposition," or "PVD" refers to any method of physically forming or depositing diamond particles in a vapor form upon a surface. Various PVD techniques are well known in the art.

As used herein, "diamond" refers to a crystalline structure of carbon atoms bonded to other carbon atoms in a lattice of tetrahedral coordination known as $sp^3$ bonding. Specifically, each carbon atom is surrounded by and bonded to four other carbon atoms, each located on the tip of a regular tetrahedron. Further, the bond length between any two carbon atoms is 1.54 angstroms at ambient temperature conditions, and the angle between any two bonds is 109 degrees, 28 minutes, and 16 seconds although experimental results may vary slightly. The structure and nature of diamond, including its physical and electrical properties are well known in the art.

As used herein, "distorted tetrahedral coordination" refers to a tetrahedral bonding configuration of carbon atoms that is irregular, or has deviated from the normal tetrahedron configuration of diamond as described above. Such distortion generally results in lengthening of some bonds and shortening of others, as well as the variation of the bond angles between the bonds. Additionally, the distortion of the tetrahedron alters the characteristics and properties of the carbon to effectively lie between the characteristics of carbon bonded in $sp^3$ configuration (i.e. diamond) and carbon bonded in $sp^2$ configuration (i.e. graphite). One example of material having carbon atoms bonded in distorted tetrahedral bonding is amorphous diamond.

As used herein, "diamond-like carbon" refers to a carbonaceous material having carbon atoms as the majority element, with a substantial amount of such carbon atoms bonded in distorted tetrahedral coordination. Diamond-like carbon (DLC) can typically be formed by PVD processes, although CVD or other processes could be used such as vapor deposition processes. Notably, a variety of other elements can be included in the DLC material as either impurities, or as dopants, including without limitation, hydrogen, sulfur, phosphorous, boron, nitrogen, silicon, tungsten, etc.

As used herein, "amorphous diamond" refers to a type of diamond-like carbon having carbon atoms as the majority element, with a substantial amount of such carbon atoms bonded in distorted tetrahedral coordination. In one aspect, the amount of carbon in the amorphous diamond can be at least about 90%, with at least about 20% of such carbon being bonded in distorted tetrahedral coordination. Amorphous diamond also has a higher atomic density than that of diamond (176 atoms/cm$^3$). Further, amorphous diamond and diamond materials contract upon melting.

The terms "heat transfer," "heat movement," and "heat transmission" can be used interchangeably, and refer to the movement of heat from an area of higher temperature to an area of cooler temperature. It is intended that the movement of heat include any mechanism of heat transmission known to one skilled in the art, such as, without limitation, conductive, convective, radiative, etc.

As used herein, "light-emitting surface" refers to a surface of a device or object from which light is intentionally emitted. Light may include visible light and light within the ultraviolet spectrum. An example of a light-emitting surface may include, without limitation, a nitride layer of an LED, or of semiconductor layers to be incorporated into an LED, from which light is emitted.

As used herein, "substrate" refers to a support surface to which various materials can be joined in forming a semiconductor or semiconductor-on-diamond device. The substrate may be any shape, thickness, or material, required in order to achieve a specific result, and includes but is not limited to metals, alloys, ceramics, and mixtures thereof. Further, in some aspects, the substrate may be an existing semiconductor device or wafer, or may be a material which is capable of being joined to a suitable device.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Invention

The present invention provides stress regulated semiconductor devices and methods associated therewith. Such devices can provide more effective cooling than traditional devices, and as such can be operated at a higher operational power. In one aspect, a vertical design for a semiconductor device can be utilized. One example of a vertical design semiconductor is a vertical stack LED. Much of the following discussion is directed to vertical stack LED devices for convenience. It is noted that this is for convenience sake, and that any type of semiconductor device and/or semiconductor configuration or design is considered to be within the present scope.

One potential technique for cooling a vertical stack LED is the use of a copper coated wafer to provide an integrated heat spreader that is intimately in contact with the semiconductor material. One problem, however, exists due to the difference in the coefficient of thermal expansion (CTE) between copper and many semiconductor materials. There can be a 3 times difference in the CTE of copper compared to a semiconductor material such as silicon. When such an LED is operated at high temperature, the copper expands and contracts to a much greater extent than semiconductor materials for a given temperature change, and can result in microcracks, delamination, and other defects at the interface between the copper and the semiconductor materials. These microcracks can lead to LED failure over time.

In addition to operational failures, in some cases defects can be introduced into a semiconductor device during the manufacturing process. For example, one technique of manufacturing may be to couple a metal heat spreader to a semiconductor material by soldering. Thermal mismatch between these materials during soldering can cause defects, cracking, delamination, and the like to occur or begin to occur.

The inventors have discovered that various materials can be used to moderate the CTE mismatch between a heat spreading material such as copper and a semiconductor, and thus decrease the interface stress therebetween due to temperature cycling during manufacture and/or use. Such materials can include, without limitation, various forms of diamond, graphite, boron nitrides, and the like. As an additional advantage, these materials tend to be good thermal conductors, and thus facilitate the movement of heat from the semiconductor. Much of the following discussion is directed to diamond materials for convenience, and it is noted that any material capable of moderating the CTE between disparate materials should be considered to be within the present scope.

Semiconductor devices according to aspects of the present invention can be utilized in a variety of applications, including LEDs, laser diodes, p-n junction devices, p-i-n junction devices, SAW and BAW filters, and the like. In one aspect, the semiconductor device is an LED device. In one specific aspect, the semiconductor device is an LED device with a vertical stack configuration.

In one aspect, as is shown in FIG. 1, a stress regulated semiconductor device 10 can include a semiconductor layer 12, a carbon layer 14 formed on the semiconductor layer 12, and a heat spreader 16 coupled to the carbon layer 14 opposite the semiconductor layer 12. The carbon layer 14 is operable to reduce the CTE difference between the semiconductor layer 12 and the heat spreader 16 to less than or equal to about 10 ppm/° C. In another aspect, the carbon layer is operable to reduce the CTE difference between the semiconductor layer and the heat spreader to less than or equal to about 5 ppm/° C. Additionally, the carbon layer can be conductive, non-conductive, or semiconductive, depending on the design of the device. It should be noted that in FIG. 1 and all following FIGS., the semiconductor layer 12 can be one or more layers, junctions, structures, and the like.

The carbon layer can be a single carbon layer or multiple carbon layers, and can include other materials or material layers such as, for example, carbide formers. The term "stress regulating interface layer" can be used to describe one or more carbon layers and any associated materials or material layers therewith. For example, in one aspect a stress regulating interface layer can include a carbon layer and a carbide former.

Figure 2:
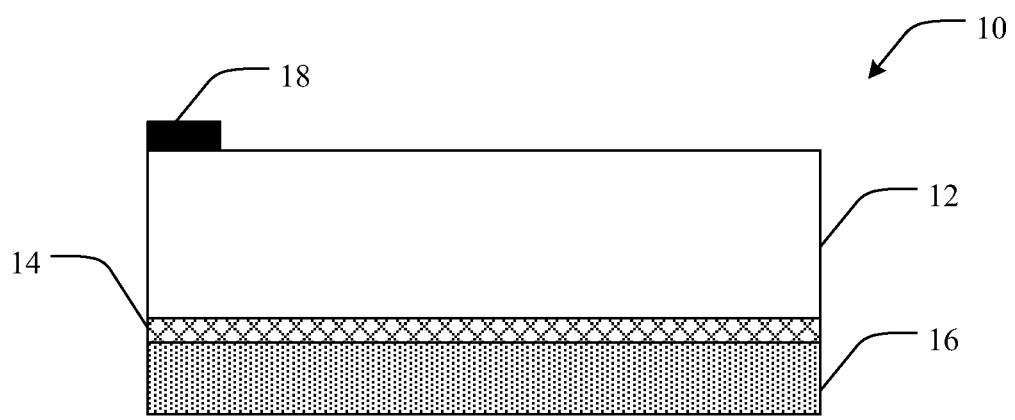
FIG. 2 is a cross-section view of a stress regulated semiconductor device in accordance with another embodiment of the present invention.

One benefit of the vertical stack design relates to the placement of electrical contacts in association with the semiconductor. As opposed to more traditional designs, electrical contacts in a vertical stack LED are located on opposite sides of the semiconductor from one another. This allows a linear flow of current from one electrical contact to the other. As is shown in FIG. 2, for example, a vertical stack device 20 can include a semiconductor layer 12, a carbon layer 14 formed on the semiconductor layer, and a heat spreader layer 16 formed on the carbon layer opposite the semiconductor layer. In addition, an electrical contact 18 can be coupled to the semiconductor layer on an opposite side from the heat spreader layer 16. In this case, the carbon layer is conductive to allow the carbon layer and/or the heat spreader layer to act as the other electrical contact. Thus, electrical current flows linearly from one electrical contact to the other. It should be noted that, in some aspects, a second electrical contact in addition to the carbon layer and/or the heat spreader layer can be coupled to the device.

Figure 3:
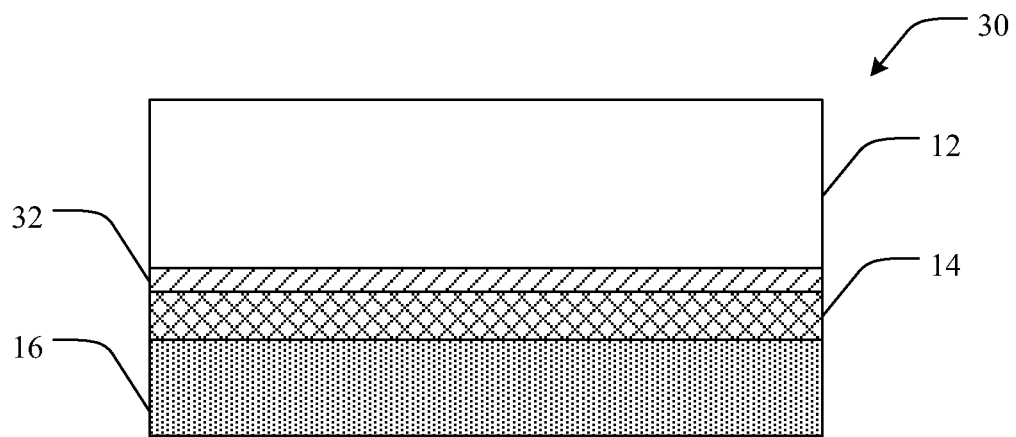
FIG. 3 is a cross-section view of a stress regulated semiconductor device in accordance with yet another embodiment of the present invention.

Various additional layers are also contemplated for inclusion in devices according to aspects of the present invention. For example, for many applications, including light-generating devices, it can be beneficial to include a reflective layer positioned to focus and/or direct light. As one example, as is shown in FIG. 3, an LED device 30 can include a reflective layer 32 disposed between the carbon layer 14 and the semiconductor layer 12. Light generated in the semiconductor layer of the vertical stack LED device can be transmitted in multiple directions. One portion of the light can be transmitted forward through the semiconductor layer 12 and out of the device in a direction away from the heat spreader layer 16. Another portion can be transmitted from the semiconductor layer 12 toward the heat spreader layer 16 and the carbon layer 14. Thus the reflective layer 32 can function to reflect at least a portion of this light back through the semiconductor layer and out of the LED, thus increasing the light output of the device. Depending on the optical properties of the particular diamond layer used, the reflective layer can be disposed between the semiconductor layer and the carbon layer as shown, or it can be disposed between the carbon layer and the heat spreader layer (not shown).

Figure 4:
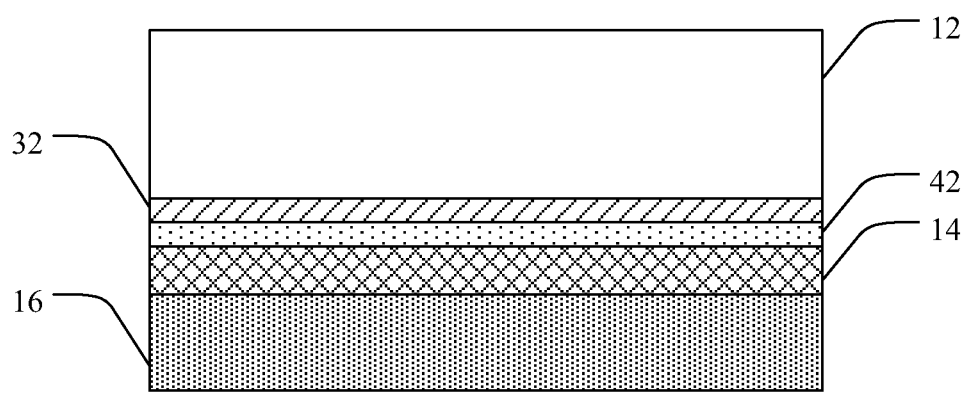
FIG. 4 is a cross-section view of a stress regulated semiconductor device in accordance with another embodiment of the present invention.
Figure 5:
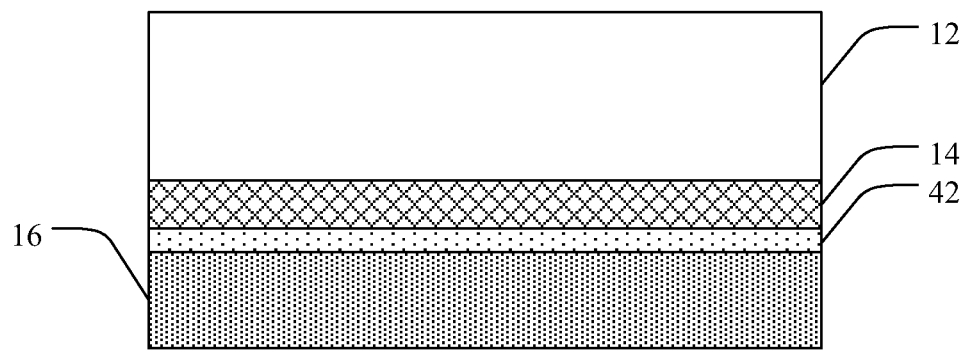
FIG. 5 is a cross-section view of a stress regulated semiconductor device in accordance with yet another embodiment of the present invention.

In some aspects, it can be beneficial to provide an interlayer between the carbon layer and another layer that the carbon layer is bonded to. For example, a carbide former layer can improve the bonding between a carbon material such as diamond and a variety of other materials. As is shown in FIG. 4, for example, a carbide former layer 42 can be disposed between the carbon layer 14 and the reflective layer 32 in order to improve the coupling of the carbon layer to the reflective layer. In another aspect, as is shown in FIG. 5, a carbide former layer 42 can be disposed between the carbon layer 14 and the heat spreader layer 16 in order to improve the coupling of the heat spreader layer to the carbon layer. A carbide former layer can also be utilized between a carbon layer and a semiconductor layer (not shown).

Additionally, the CTE mismatch can be further moderated by utilizing multiple carbon layers. Furthermore, in some aspects it can be beneficial to alternate additional layers in between multiple carbon layers. For example, in one aspect a stack of multiple carbon layers can include carbide former layers interspersed between the carbon layers. In one specific aspect, a stress regulating interface layer can include multiple carbon layers having titanium layers interspersed therebetween to provide improved CTE matching between the heat spreader and the semiconductor layer. In one specific aspect, a stress regulating interface layer can include alternating layers of DLC and a carbide former such as Ti to improve CTE matching.

Figure 6:
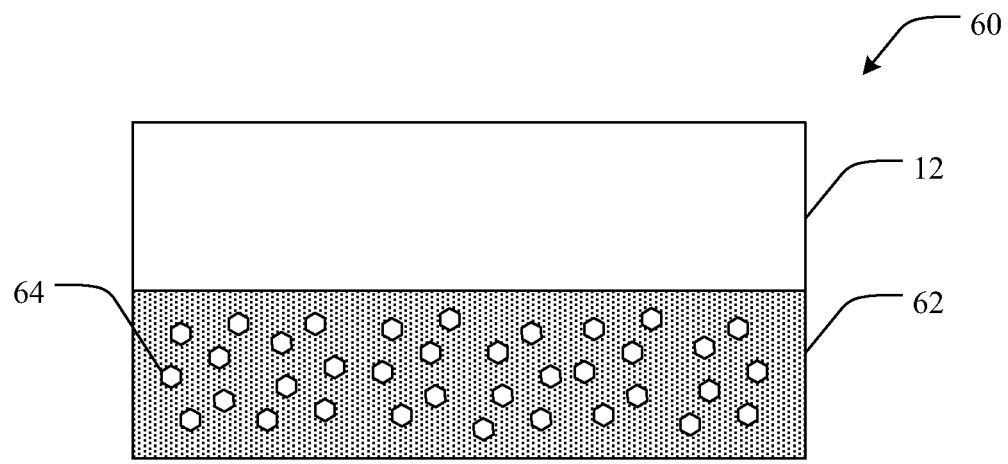
FIG. 6 is a cross-section view of a stress regulated semiconductor device in accordance with another embodiment of the present invention.
Figure 7:
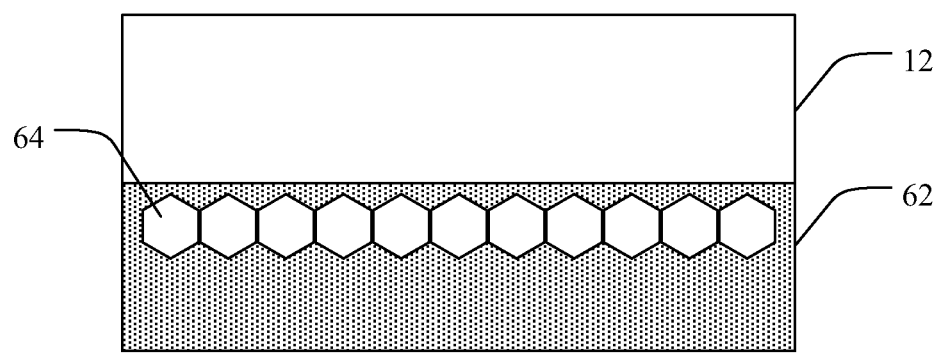
FIG. 7 is a cross-section view of a stress regulated semiconductor device in accordance with another embodiment of the present invention.

In addition to diamond layers, diamond particles 64 can also be utilized to reduce the CTE mismatch between the metal heat spreader and the semiconductor layer. As is shown in FIG. 6, for example, a stress regulated semiconductor device 60 can include a semiconductor layer 12 and a heat spreader layer 62 formed on the semiconductor layer 12. Diamond particles 64 are uniformly disposed within the metal heat spreader layer 62. The presence of the diamond particles can reduce the CTE mismatch between the semiconductor layer and the heat spreader layer. As is shown in FIG. 7, the diamond particles 64 can also be arranged in a monolayer. In one aspect, the diamond particles are operable to reduce the CTE difference between the semiconductor layer and the metal matrix to less than or equal to about 10 ppm/° C. In another aspect, the diamond particles are operable to reduce the CTE difference between the semiconductor layer and the metal matrix to less than or equal to about 5 ppm/° C. It can be beneficial to form the heat spreader layer including the diamond particles on the semiconductor layer during manufacture of the semiconductor device, as opposed to making a diamond monolayer/metal heat spreader device separately for later attachment, as the soldering step is avoided.

Figure 8:
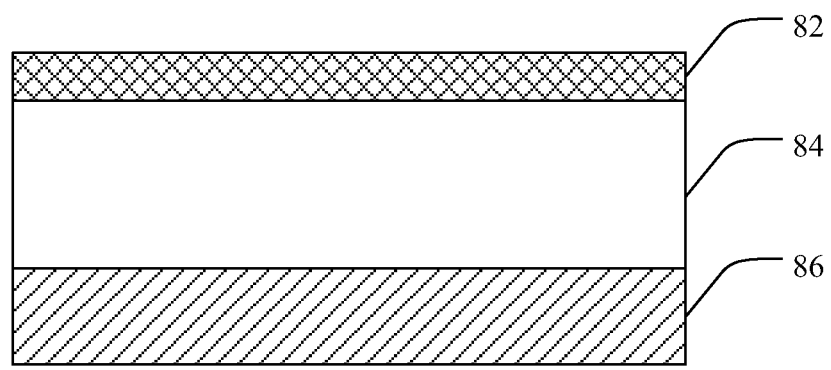
FIG. 8 is a cross-section view of a stress regulated semiconductor device in accordance with yet another embodiment of the present invention.
Figure 9:
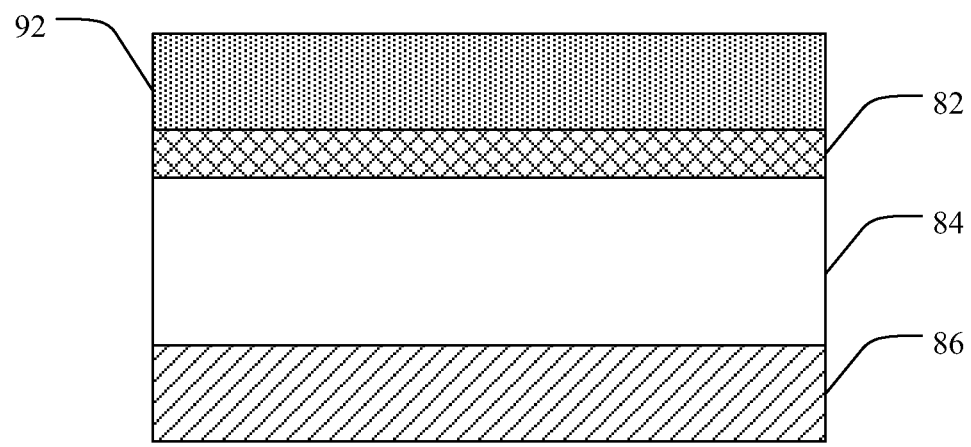
FIG. 9 is a cross-section view of a stress regulated semiconductor device in accordance with another embodiment of the present invention.
Figure 10:
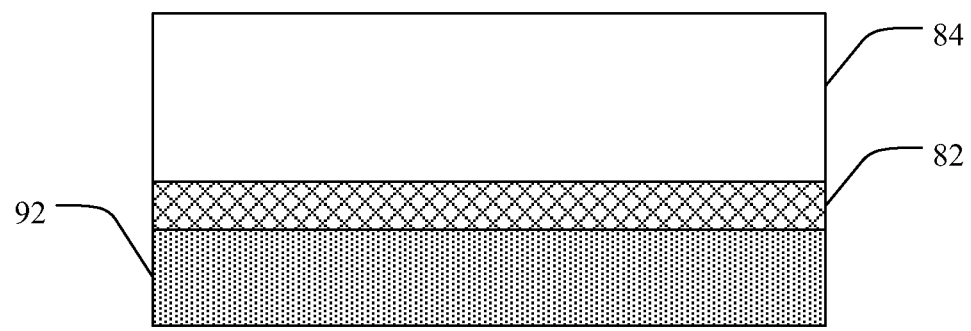
FIG. 10 is a cross-section view of a stress regulated semiconductor device in accordance with yet another embodiment of the present invention.

In another aspect of the present invention, a stress regulated semiconductor device can be made according to the following method. As is shown in FIG. 8, a carbon layer 82 is formed on a semiconductor layer 84 having a substrate 86 such as sapphire. In one specific aspect, the semiconductor layer can include GaN. In some aspects, a carbide former layer can be deposited between the carbon layer 82 and the semiconductor layer 84 to improve bonding as has been described (not shown). As is shown in FIG. 9, a heat spreader layer 92 is formed on the carbon layer 82. In some aspects, a carbide former layer can be deposited on the carbon layer 82 to improve bonding with the heat spreader layer 92 as has been described (not shown). Additionally, the heat spreader layer can be thickened to improve the thermal conductivity and/or physical stability of the device. The substrate 86 can be removed as is shown in FIG. 10, and in some aspects, subsequent semiconductive structures can be deposited on the exposed surface of the semiconductor layer 84. The substrate can be removed by a variety of known methods, including laser splitting, mechanical removal, chemical etching, and the like. In some aspects, the exposed surface of the semiconductor layer can be leveled or planarized to improve subsequent deposition thereupon. Note that the device is shown rotated 180° in FIG. 10 for clarity.

In another aspect of the present invention, a method for reducing stress induced defects in a semiconductor device is provided. Such a method can include forming a diamond layer on a semiconductor layer and coupling a heat spreader layer to the diamond layer opposite the semiconductor layer. The diamond layer reduces the coefficient of thermal expansion difference between the semiconductor layer and the heat spreader to less than or equal to about 10 ppm/° C. In one aspect, the method can additionally include forming a reflective layer between the diamond layer and the semiconductor layer. As has been described, in some aspects a carbide former layer can be formed between the diamond layer and the reflective layer. In other aspects, a carbide former layer can be formed between the diamond layer and the heat spreader layer. In yet another aspect, coupling the heat spreader to the diamond layer includes forming the heat spreader on the diamond layer.

Numerous types of carbon materials are contemplated for use as carbon layers according to aspects of the present invention. Non-limiting examples include amorphous diamond, diamond-like carbon, polycrystalline diamond, crystalline diamond, single crystal diamond, graphite, and the like. In one aspect, the carbon layer can be an amorphous diamond layer. In another aspect, the carbon layer can be a diamond-like carbon layer. It should be noted that any type of carbon layer can be utilized provided the layer can be formed on a semiconductor layer.

In one aspect, improved CTE matching can be achieved by utilizing a stress regulating interface layer having a carbon layer with an amorphous atomic structure. Examples of such amorphous materials can include diamond-like carbon, amorphous diamond, and the like. Without intending to be bound by any scientific theory, amorphous materials such as diamond-like carbon have a high elastic or yield limit due to their non-crystalline structure. Thus when disposed between two rigid structures such as a heat spreader and a semiconductor during heating and cooling, the amorphous structure of materials such as diamond-like carbon can absorb the expansion and contraction differences between these materials as they expand and contract at different rates.

The carbon layers according to aspects of the present invention can be of any thickness that would allow thermal cooling and CTE mismatch moderation of a semiconductor device. Thicknesses can vary depending on the application and the semiconductor device configuration. For example, greater cooling requirements may require thicker carbon layers. The thickness may also vary depending on the material used in the carbon layer. In some aspects, particularly those where the thickness of the device is to be minimized, it can be beneficial to utilize a carbon layer that is no thicker than necessary for the application. That being said, in one aspect a carbon layer may be from about 10 microns to about 300 microns thick. In another aspect, a carbon layer may be less than or equal to about 10 microns thick. In yet another aspect, a carbon layer may be from about 50 microns to about 100 microns thick. In a further aspect, a carbon layer may be greater than about 50 microns thick. In yet another aspect, the carbon layer can be from about 1 micron to about 30 microns thick. In a further aspect, the carbon layer can be from about 5 microns to about 30 microns thick. In yet a further aspect, the carbon layer can be less than about 1 micron thick. In one aspect, the carbon layer can be from about 0.1 microns to about 10 microns thick. In another aspect, the carbon layer can be from about 0.5 microns to about 2 microns thick.

In one aspect, the carbon layer can be a diamond material such as, for example, crystalline diamond, amorphous diamond, diamond-like carbon, and the like. Diamond materials have excellent thermal conductivity properties that make them ideal for incorporation into semiconductor devices as has been described herein. The transfer of heat that is present in the semiconductor device can thus be accelerated from the device through a diamond material. It should be noted that the present invention is not limited as to specific theories of heat transmission. As such, in one aspect the accelerated movement of heat from inside the device can be at least partially due to heat movement into and through a diamond layer. Due to the heat conductive properties of diamond, heat can rapidly spread laterally through the diamond layer and to the edges of a semiconductor device. Heat present around the edges will be more rapidly dissipated into the air or into surrounding structures, such as heat spreaders or device supports. Additionally, the diamond layer can thermally conduct heat to the metal heat spreader layer that is intimately contacted therewith. Because the thermal conductivity of diamond is greater than the thermal conductivity of a semiconductor layer to which it is thermally coupled, a heat sink is established by the diamond layer. Thus heat that builds up in the semiconductor layer is drawn into the diamond layer and spread laterally to be transferred into the metal heat spreader. Such accelerated heat transfer can result in semiconductor devices with much cooler operational temperatures. Additionally, the acceleration of heat transfer not only cools a semiconductor device, but may also reduce the heat load on many electronic components that are spatially located nearby the semiconductor device.

It should be understood that the following is a very general discussion of diamond deposition techniques that may or may not apply to a particular layer or application, and that such techniques may vary widely between the various aspects of the present invention. Additionally, and as has been noted, other materials such as boron nitride and graphite are included within the present scope. The following deposition techniques should also be applied to those materials where applicable. Generally, diamond layers may be formed by any means known, including various vapor deposition techniques. Any number of known vapor deposition techniques may be used to form these diamond layers. Common vapor deposition techniques include chemical vapor deposition (CVD) and physical vapor deposition (PVD), although any similar method can be used if similar properties and results are obtained. In one aspect, CVD techniques such as hot filament, microwave plasma, oxyacetylene flame, rf-CVD, laser CVD (LCVD), metal-organic CVD (MOCVD), laser ablation, conformal diamond coating processes, and direct current arc techniques may be utilized. Typical CVD techniques use gas reactants to deposit the diamond or diamond-like material in a layer, or film. These gases generally include a small amount (i.e. less than about 5%) of a carbonaceous material, such as methane, diluted in hydrogen. A variety of specific CVD processes, including equipment and conditions, as well as those used for semiconductor layers, are well known to those skilled in the art. In another aspect, PVD techniques such as sputtering, cathodic arc, and thermal evaporation may be utilized. Additionally, molecular beam epitaxy (MBE), atomic layer deposition (ALD), and the like can additionally be used. Further, specific deposition conditions may be used in order to adjust the exact type of material to be deposited, whether DLC, amorphous diamond, or pure diamond.

In some aspects a nucleation enhancer layer or carbide former layer can be formed on the growth surface of a substrate in order to improve the quality and deposition time of the diamond layer. As has been described, the diamond layer can be deposited on various material layers, such as a semiconductor layer or reflective layer. In one aspect, a diamond layer can be formed by depositing applicable nuclei, such as diamond nuclei, on a diamond growth surface of a substrate and then growing the nuclei into a film or layer using a vapor deposition technique. In one aspect of the present invention, a nucleation enhancer layer can be coated upon the substrate to enhance the growth of the diamond layer. Diamond nuclei are then placed upon the nucleation enhancer layer, and the growth of the diamond layer proceeds via CVD.

A variety of suitable materials will be recognized by those in skilled in the art which can serve as a nucleation enhancer. In one aspect of the present invention, the nucleation enhancer may be a material selected from the group consisting of metals, metal alloys, metal compounds, carbides, carbide formers, and mixtures thereof. In another aspect, the nucleation enhancer layer can be a carbide former layer including a carbide former material. Examples of carbide former materials may include, without limitation, tungsten (W), tantalum (Ta), titanium (Ti), zirconium (Zr), chromium (Cr), molybdenum (Mo), silicon (Si), and manganese (Mn). Additionally, examples of carbides include tungsten carbide (WC), silicon carbide (SiC), titanium carbide (TiC), zirconium carbide (ZrC), and mixtures thereof among others. In one specific aspect, the carbide former layer can be Ti. In another specific aspect, the carbide former layer can be Cr. It should be noted that a carbide former layer can be utilized to enhance the deposition of a diamond layer, a carbon layer, a boron nitride layer, or an additional material such as a heat spreader material upon one or more of the aforementioned layers. Additionally, a carbide former layer can be utilized to improve bonding between layers, and many not necessarily involve enhanced nucleation in all cases.

In one specific aspect, useful carbide formers can include Ti, W, TiW, Cr, Pt, Zr, V, and the like.

A nucleation enhancer layer or a carbide former layer, when used, is a layer that is thin enough that it does not to adversely affect the thermal transmission properties of the device. In one aspect, the thickness of these layers may be less than about 0.5 micrometers. In another aspect, the thickness may be less than about 10 nanometers. In yet another aspect, the thickness is less than about 5 nanometers. In a further aspect of the invention, the thickness is less than about 3 nanometers.

Diamond materials having higher proportions of sp3 bonds have higher thermal conductivity while moderating CTE mismatch between the heat spreader and the semiconductor layer. Various methods may be employed that can affect the sp3 content of the diamond in the diamond layer that is created by vapor deposition techniques. For example, reducing the methane flow rate and increasing the total gas pressure during the early phase of diamond deposition can decrease the decomposition rate of carbon, and increase the concentration of hydrogen atoms. Thus a significantly higher percentage of the carbon will be deposited in a $sp^3$ bonding configuration, and thus the quality of the diamond nuclei formed can be increased. Additionally, the nucleation rate of diamond particles deposited on a growth surface of the substrate or the nucleation enhancer layer can be increased in order to reduce the amount of interstitial space between growing diamond particles. Examples of ways to increase nucleation rates include, but are not limited to; applying a negative bias in an appropriate amount, often about 100 volts, to the growth surface; polishing the growth surface with a fine diamond paste or powder, which may partially remain on the growth surface; and controlling the composition of the growth surface such as by ion implantation of C, Si, Cr, Mn, Ti, V, Zr, W, Mo, Ta, and the like by PVD or PECVD. PVD processes are typically at lower temperatures than CVD processes and in some cases can be below about 250° C. such as about 150° C. Other methods of increasing diamond nucleation will be readily apparent to those skilled in the art.

In one aspect of the present invention, the carbon layer may be formed as a conformal diamond layer. Conformal diamond coating processes can provide a number of advantages over conventional diamond film processes. Conformal diamond coating can be performed on a wide variety of substrates, including non-planar substrates. A growth surface can be pretreated under diamond growth conditions in the absence of a bias to form a carbon film. The diamond growth conditions can be conditions that are conventional CVD deposition conditions for diamond without an applied bias. As a result, a thin carbon film can be formed which is typically less than about 100 angstroms. The pretreatment step can be performed at almost any growth temperature such as from about 200° C. to about 900° C., although lower temperatures below about 500° C. may be preferred. Without being bound to any particular theory, the thin carbon film appears to form within a short time, e.g., less than one hour, and is a hydrogen terminated amorphous diamond.

Following formation of the thin carbon film, the growth surface may then be subjected to diamond growth conditions to form a conformal diamond layer. The diamond growth conditions may be those conditions which are commonly used in traditional CVD diamond growth. However, unlike conventional diamond film growth, the diamond film produced using the above pretreatment steps results in a conformal diamond film that typically begins growth substantially over the entire growth surface with substantially no incubation time. In addition, a continuous film, e.g. substantially no grain boundaries, can develop within about 80 nm of growth. Diamond layers having substantially no grain boundaries may move heat more efficiently than those layers having grain boundaries.

Additionally, in some aspects the carbon layer can be a conductive carbon layer such as a diamond layer. Various techniques may be employed to render a diamond layer conductive. Such techniques are known to those of ordinary skill in the art. For example, various impurities may be doped into the crystal lattice of the diamond layer. Such impurities may include elements such as Si, B, P, N, Li, Al, Ga, etc. In one specific aspect, for example, the diamond layer may be doped with B. Impurities may also include metallic particles within the crystal lattice, provided they do not interfere with the function of the device, such as by blocking light emitted from an LED.

Various semiconductor materials are contemplated that can be used in the devices of the present invention. The semiconductor layer may include any material that is suitable for forming electronic devices, semiconductor devices, or the like. Many semiconductors are based on silicon, gallium, indium, and germanium. Suitable materials for the semiconductor layer can include, without limitation, silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, indium gallium nitride, and composites thereof. In one aspect, however, the semiconductor layer can include silicon, silicon carbide, gallium arsenide, gallium nitride, gallium phosphide, aluminum nitride, indium nitride, indium gallium nitride, aluminum gallium nitride, or composites of these materials. In one specific aspect, the semiconductor material includes gallium nitride. In another specific aspect, the semiconductor material includes aluminum nitride. In yet another aspect, the semiconductor material includes indium nitride. In a further aspect, the semiconductor includes (Al, Ga, In)N.

Additionally, semiconductor materials may be of any structural configuration known, for example, without limitation, cubic (zincblende or sphalerite), wurtzitic, rhombohedral, graphitic, turbostratic, pyrolytic, hexagonal, amorphous, or combinations thereof. As such, the semiconductor layer can be formed by any method known to one of ordinary skill in the art. Various known methods of vapor deposition can be utilized, as has been described. Additionally, surface processing may be performed between any of the deposition steps described in order to provide a smooth surface for subsequent deposition. Such processing may be accomplished by any means known, such as by chemical etching, polishing, buffing, grinding, etc.

Various materials are contemplated for use in the heat spreader layer. Any material that can be utilized in the devices according to aspects of the present invention are considered to be within the present scope. Nonlimiting examples of such materials can include aluminum, copper, tin, tungsten, nickel, titanium, gold, silver, platinum, $Al_2O_3$, AlN, $Si_3N_4$, Si, glass, and combinations and alloys thereof, and the like, including mixtures and alloys thereof. In one aspect, the heat spreader can be a metal heat spreader. In one specific aspect, the heat spreader includes copper. In another aspect, the heat spreader includes diamond particle impregnated nickel. Additionally, the heat spreader materials can be applied to the device using any deposition technique. In one aspect, for example, the layer can be deposited by sputtering.

Following deposition of the heat spreader layer, the thickness of the layer can be increased via a thickening process. Such thickening can increase the thermal conductivity of the device, provide for additional structural support for the semiconductor materials, facilitate device handling and attachment to other substrates, and the like. As one example, a temporary support substrate can be removed from the semiconductor device once the heat spreader layer has been increased to a thickness that is capable of providing adequate support. As such, in one aspect a heat spreader has a minimum thickness for supporting the semiconductor material such that bowing does not occur. Although any method of thickening is contemplated, in one aspect a metal heat spreader can be thickened by further sputtering of the heat spreader material and/or an additional metal material. In another aspect, the metal heat spreader layer can be thickened by electroplating additional metal material thereupon. The metal material can be the same or different from the metal material originally sputtered onto the device. In some aspects, a monolayer of diamond particles can be disposed on the sputtered metal heat spreader layer. Subsequent electroplating will thicken the metal heat spreader layer, thus incorporating the diamond particles within the metal material.

EXAMPLES

The following examples illustrate various techniques of making semiconductor devices according to aspects of the present invention. However, it is to be understood that the following are only exemplary or illustrative of the application of the principles of the present invention. Numerous modifications and alternative compositions, methods, and systems can be devised by those skilled in the art without departing from the spirit and scope of the present invention. The appended claims are intended to cover such modifications and arrangements. Thus, while the present invention has been described above with particularity, the following Examples provide further detail in connection with several specific embodiments of the invention.

Example 1

A 2 inch sapphire wafer is deposited with epitaxial GaN by MOCVD (metal organic chemical vapor deposition). Trimethylgallium is used as the Ga source gas and ammonia is added to supply nitrogen atoms. Hydrogen is also added in order to dilute the gas and to gasify Ga or N atoms if they are located in unstable sites on the lattice. A multiple layered semiconductor structure is made by n-doping with Si on the sapphire followed by p-doping with Mg to form a junction. Quantum wells and intrinsic layers can be introduced between the p-doped layer and the n-doped layer. The top surface of the p-doped layer is sputtered with a reflective layer of Ag to a thickness of about 200 nm. The reflective layer is then sputtered with a nucleation enhancing layer of Ti to about 50 nm thick.

Subsequently, amorphous diamond is deposited on the nucleation enhancing layer to a thickness of about 1 μm by cathodic arc deposition. An additional nucleation enhancing layer of Ti is sputtered on the amorphous diamond layer to a thickness of about 50 nm, followed by sputtering of a Cu metal layer. The device is then removed from the deposition chamber and immersed in an electrolyte solution where the Cu layer is thickened by electroplating. A region of the GaN layer is then laser irradiated to separate the sapphire wafer from the GaN layer. The newly exposed n-doped GaN surface is then sputtered with Au as electrode at one corner. This will form a vertical stack LED with top and bottom electrodes.

Example 2

A 2 inch sapphire wafer is deposited with epitaxial GaN by MOCVD (metal organic chemical vapor deposition). Trimethylgallium is used as the Ga source gas and ammonia is added to supply nitrogen atoms. Hydrogen is also added in order to dilute the gas and to gasify Ga or N atoms if they are located in unstable sites on the lattice. A multiple layered semiconductor structure is made by n-doping with Si on the sapphire followed by p-doping with Mg to form a junction. Quantum wells and intrinsic layers can be introduced between the p-doped layer and the n-doped layer.

The top surface of the p-doped layer is cosputtered with graphite and Ag to form a reflective layer. The graphite acts to reduce the CTE of the reflective layer. In this case, the CTE can be graded by controlling Ag/C ratio. Ag coating is then resumed without graphite. The Ag layer is then thickened by electroplating with Cu or Ag.

Example 3

A 2 inch sapphire wafer is deposited with epitaxial GaN by MOCVD (metal organic chemical vapor deposition). Trimethylgallium is used as the Ga source gas and ammonia is added to supply nitrogen atoms. Hydrogen is also added in order to dilute the gas and to gasify Ga or N atoms if they are located in unstable sites on the lattice. A multiple layered semiconductor structure is made by n-doping with Si on the sapphire followed by p-doping with Mg to form a junction. Quantum wells and intrinsic layers can be introduced between the p-doped layer and the n-doped layer.

The top surface of the p-doped layer is cosputtered with graphite and Ag to form a reflective layer. The graphite acts to reduce the CTE of the reflective layer. In this case, the CTE can be graded by controlling Ag/C ratio. Ag coating is then resumed without graphite. A monolayer of micron diamond particles is spread across the Ag layer, and a Cu layer is electroplated there upon to incorporate the diamond particles. The diamond particle monolayer functions to further reduce the CTE mismatch and increase of thermal conductivity.

Example 4

A 2 inch sapphire wafer is deposited with epitaxial GaN by MOCVD (metal organic chemical vapor deposition). Trimethylgallium is used as the Ga source gas and ammonia is added to supply nitrogen atoms. Hydrogen is also added in order to dilute the gas and to gasify Ga or N atoms if they are located in unstable sites on the lattice. A multiple layered semiconductor structure is made by n-doping with Si on the sapphire followed by p-doping with Mg to form a junction. Quantum wells and intrinsic layers can be introduced between the p-doped layer and the n-doped layer.

The top surface of the p-doped layer is sputtered with a reflective layer of Ag to a thickness of about 200 nm. A Cu metal layer is sputtered onto the Ag layer. A monolayer of micron diamond particles is spread across the sputtered Cu layer, and the Cu layer is thickened by electroplating to incorporate the diamond particles to reduce the CTE mismatch and increase of thermal conductivity.

Example 5

An LED wafer with GaN on sapphire is metalized with a gold layer. An ethanol-diluted wax layer is spread across the top of the gold layer. Diamond particles of about 150 µm in size are pressed across the layer, and excess diamond particles not adhered to the layer are removed. The wafer is used as a cathode and is immersed in a liquid electrolyte with copper as the anode, and the wafer is electroplated to cover the diamond particles in-situ with copper. The sapphire layer is split by laser irradiation and removed, and the exposed GaN surface is coated with an ITO electrode except for a small area where gold is coated as an anode. The copper layer is used as the cathode. Thus vertical stack LED is made with electrodes on the opposing sides.

Example 6

An LED wafer having multiple layers of doped GaN on sapphire is sputtered with a reflector layer of Ag, and then a nucleation enhancer layer of Ti. An electrically conductive amorphous diamond layer is then deposited on the Ti layer by cathodic arc. The amorphous diamond is metalized by sputtering with Cr followed by Cu. The Cu layer is thickened by conventional electroplating, resulting in copper bonded GaN.

Example 7

A 2 inch sapphire wafer is deposited with epitaxial GaN by MOCVD. Trimethylgallium is used as the Ga source gas and ammonia is added to supply nitrogen atoms. Hydrogen is also added in order to dilute the gas and to gasify Ga or N atoms if they are located in unstable sites on the lattice. A multiple layered semiconductor structure is made by n-doping with Si on the sapphire followed by p-doping with Mg to form a junction. Quantum wells and intrinsic layers can be introduced between the p-doped layer and the n-doped layer. The top surface of the p-doped layer is sputtered with a reflective layer of Ag to a thickness of about 200 nm. The reflective layer is then sputtered with a nucleation enhancing layer of Ti to about 50 nm thick.

Subsequently, amorphous diamond is deposited on the nucleation enhancing layer to a thickness of about 1 µm by cathodic arc deposition. An additional nucleation enhancing layer of Ti is sputtered on the amorphous diamond layer to a thickness of about 50 nm, followed by sputtering of a Cu metal layer. The device is then removed from the deposition chamber and immersed in an electrolyte solution including Ni and diamond particles for Ni-diamond layer coating by electroplating. The diamond content is about 30 Vol %. A region of the GaN layer is then laser irradiated to separate the sapphire wafer from the GaN layer. The newly exposed n-doped GaN surface is then sputtered with Au as electrode at one corner. This will form a vertical stack LED with top and bottom electrodes.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A stress regulated semiconductor device, comprising:
   a semiconductor layer;
   a stress regulating interface layer including a carbon layer bonded to the semiconductor layer by a carbide former;
   a heat spreader coupled to the stress regulating interface layer opposite the semiconductor layer, wherein the stress regulating interface layer is operable to reduce the coefficient of thermal expansion difference between the semiconductor layer and the heat spreader to less than or equal to about 10 ppm/° C.; and
   a carbide former disposed between the stress regulating carbon layer and the heat spreader layer.

2. The device of claim 1, wherein the stress regulating interface layer is operable to reduce the coefficient of thermal expansion difference between the semiconductor layer and the heat spreader to less than or equal to about 5 ppm/° C.

3. The device of claim 1, wherein the semiconductor material includes a member selected from the group consisting of silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and composites thereof.

4. The device of claim 1, wherein the semiconductor material includes a member selected from the group consisting of gallium nitride, aluminum nitride, indium nitride, and composites thereof.

5. The device of claim 1, wherein the carbon layer is a member selected from the group consisting of diamond-like carbon, boron-doped diamond, amorphous diamond, crystalline diamond, polycrystalline diamond, graphite, and combinations thereof.

6. The device of claim 5, wherein the carbon layer has an amorphous atomic structure.

7. The device of claim 6, wherein the carbon layer is diamond-like carbon.

8. The device of claim 1, wherein the carbon layer is electrically conductive.

9. The device of claim 1, wherein the heat spreader includes a member selected from the group consisting of aluminum, copper, tin, tungsten, nickel, titanium, gold, silver, platinum, $Al_2O_3$, AlN, $Si_3N_4$, Si, glass, and combinations and alloys thereof.

10. The device of claim 1, wherein the heat spreader includes copper.

11. The device of claim 1, further comprising a reflective layer coupled to the stress regulating interface layer.

12. A stress regulated semiconductor device, comprising:
a semiconductor layer;
a heat spreader formed on the semiconductor layer, the heat spreader including a plurality of diamond particles disposed within a metal matrix as a monolayer, wherein the diamond particles are operable to reduce the coefficient of thermal expansion difference between the semiconductor layer and the metal matrix to less than or equal to about 10 ppm/° C.

13. The device of claim 12, wherein the diamond particles are operable to reduce the coefficient of thermal expansion difference between the semiconductor layer and the metal matrix to less than or equal to about 5 ppm/° C.

14. The device of claim 12, wherein the diamond particles are dispersed uniformly in the metal matrix at less than or equal to about 60 Vol %.

15. A method for reducing stress induced defects in a semiconductor device, comprising:
forming a stress regulating interface layer including a carbon layer on a semiconductor layer;
coupling a heat spreader layer to the carbon layer opposite the semiconductor layer, wherein the stress regulating interface layer reduces the coefficient of thermal expansion difference between the semiconductor layer and the heat spreader to less than or equal to about 10 ppm/° C. and;
forming a carbide former layer between the carbon layer and the heat spreader layer.

16. The method of claim 15, further comprising forming a carbide former layer between the carbon layer and the semiconductor layer.

17. The method of claim 15, wherein coupling the heat spreader to the carbon layer includes forming the heat spreader on the carbon layer.

* * * * *